(12) United States Patent
Akimoto et al.

(10) Patent No.: US 6,403,218 B1
(45) Date of Patent: Jun. 11, 2002

(54) NICKEL COMPOSITE PARTICLE AND PRODUCTION PROCESS THEREFOR

(75) Inventors: Yuji Akimoto, Fukuoka; Kazuro Nagashima, Ohnojo; Hiroshi Yoshida, Ohnojo; Yiyi Ma, Ohnojo, all of (JP)

(73) Assignee: Shoei Chemical Inc., Tokyo (JP)

( * ) Notice: Subject to any disclaimer, the term of this patent is extended or adjusted under 35 U.S.C. 154(b) by 0 days.

(21) Appl. No.: 09/398,362

(22) Filed: Sep. 17, 1999

(30) Foreign Application Priority Data

Oct. 6, 1998 (JP) ............................................. 10-297573
Aug. 19, 1999 (JP) ............................................. 11-232104

(51) Int. Cl.$^7$ .............................. B32B 15/00; B22F 1/00
(52) U.S. Cl. .................... 428/403; 428/469; 428/472.2; 428/702; 75/228
(58) Field of Search ................................ 428/328, 329, 428/330, 403, 469, 472.2, 697, 701, 702; 75/228

(56) References Cited

U.S. PATENT DOCUMENTS

| | | | |
|---|---|---|---|
| 3,172,753 A | | 3/1965 | Walsh ............................... 75/5 |
| 5,126,915 A | | 6/1992 | Pepin et al. ................. 361/304 |
| 5,871,840 A | * | 2/1999 | Asada et al. .................. 428/328 |
| 5,939,353 A | * | 8/1999 | Bhattacharyya et al. .... 502/524 |
| 5,964,918 A | * | 10/1999 | Asada et al. ................... 75/351 |
| 6,007,743 A | * | 12/1999 | Asada et al. ................. 252/513 |
| 6,060,165 A | * | 5/2000 | Asada et al. ................. 428/403 |

FOREIGN PATENT DOCUMENTS

| | | |
|---|---|---|
| JP | 55-82703 | 6/1980 |
| JP | 63-31522 | 6/1988 |
| JP | 6-279816 | 10/1994 |
| JP | 11-21644 | 1/1999 |

* cited by examiner

*Primary Examiner*—Deborah Jones
*Assistant Examiner*—Stephen Stein
(74) *Attorney, Agent, or Firm*—Flynn, Thiel, Boutell & Tanis, P.C.

(57) ABSTRACT

Nickel composite particles having a layer of a nickel-containing spinel on at least a part of the surface of nickel particles, or nickel composite particles having an oxide layer of a metal other than nickel on at least a part of the surface of nickel particles and a layer of a nickel-containing spinel at an interface between the nickel particles and the metal oxide layer. The nickel composite particles are produced by forming fine liquid droplets from a solution containing (a) at least one thermally decomposable nickel compound and (b) at least one thermally decomposable metal compound capable of forming a spinel together with nickel; and heating the liquid droplets at a temperature higher than the decomposition temperatures of compounds (a) and (b) to form nickel particles and simultaneously deposit a nickel-containing spinel layer, or further, a metal oxide layer on the spinel layer. The composite particles are especially useful for the preparation of a conductor paste used in an internal conductor layer of a ceramic multilayer electronic part.

4 Claims, No Drawings

NICKEL COMPOSITE PARTICLE AND PRODUCTION PROCESS THEREFOR

BACKGROUND OF THE INVENTION

1. Field of the Invention

The present invention relates to a novel nickel composite particle suitable for use in a thick-film conductor paste and to a production process therefor, and further to a conductor paste containing the nickel composite particles and to a multilayer electronic part having a conductive layer formed using the paste.

2. Description of the Prior Art

In the electronic field, a thick-film paste such as a conductor paste or resistor paste is used to produce electronic circuits and parts such as resistors, capacitors and IC packages. This thick-film paste is prepared by uniformly mixing conductive particles such as metal, alloy or metal oxide particles with an organic vehicle together with a vitreous binder and other additives as required and dispersing them into the organic vehicle to obtain a paste state. The thick-film paste is applied to a substrate and then fired at a high temperature to form a conductor film or resistor film.

Ceramic multilayer electronic parts such as multilayer capacitors and multilayer inductors, and ceramic multilayer substrates are generally produced by laminating a plurality of unfired ceramic green sheets of a dielectric or magnetic material, etc., and a plurality of internal conductor paste layers alternately and co-firing the resulting multilayer stack at a high temperature. A precious metal such as palladium, silver-palladium or platinum has been mainly used as an internal conductor in the prior art but a base metal material such as nickel has been attracting much attention to meet a demand for saving resources and eliminating the problems of delamination or cracking, etc., caused due to the expansion of palladium or silver-palladium by oxidation during the firing step.

There is a tendency that the number of layers to be laminated together is increased more in these multilayer parts and multilayer substrates. For example, a multilayer capacitor consisting of several hundreds of layers has recently been produced. Therefore, a reduction in the thickness of each ceramic layer and a further reduction in the thickness of an internal conductor layer are required. For example, when the thickness of a ceramic layer is 3 $\mu$m or so, the thickness of an internal conductor film must be 1 $\mu$m or less, preferably 0.5 $\mu$m or so. If not, a center portion of the obtained multilayer stack will become thick and a structural defect and a reduction in reliability will be caused.

However, when normal nickel particles are used in the internal conductor paste, the obtained internal conductor becomes a discontinuous film due to the oversintering of the nickel particles at the time of firing, which causes such problems as a rise in resistance value, internal disruption and an increase in the thickness of the conductor. Thus, there has been limitation in reducing the thickness of the internal conductor. That is, when the nickel particles are fired in a non-oxidative atmosphere such as an inert atmosphere or reducing atmosphere to prevent oxidation, sintering begins early, even monocrystal particles having relatively low activity begin to sinter and shrink at a low temperature of 400° C. or less. The temperature at which a ceramic layer begins to sinter is generally much higher than that temperature, for example, about 1,200° C. in the case of barium titanate. Since barium titanate does not shrink together with a nickel film even when it is co-fired with the nickel film, the nickel film is pulled in a planar direction. Therefore, it is considered that small voids generated in the nickel film by sintering at a relatively low temperature easily grow to large holes along with the proceeding of sintering at a high temperature range and also the film easily grows in a thickness direction. Therefore, to reduce the thickness of the nickel internal conductor layer, it is considered to be necessary to make nickel particles finer and highly dispersible to prevent the generation of voids at the time of firing as much as possible and further to make coincide the sintering and shrinkage behaviors of the conductor layer with those of a ceramic layer.

When a thick film is formed, uncoincidence of sintering and shrinking behaviors between the conductor layer and the ceramic layer as described above creates structural defects, such as delamination and cracking, etc., thereby lowering the yield and reliability, which is a problem.

Heretofore, various studies have been made to delay the sintering of a conductor until the sintering initiation temperature of the ceramic layer. For example, the addition of various metal oxides or ceramic particles having the same composition as those used in the ceramic layer makes it possible to delay the apparent initiation temperature of shrinkage of the conductor film to around 800° C. However, since the sintering properties of metal particles themselves are not suppressed, when sintering is carried out at a high temperature of 1,300° C., or so, the continuity and conductivity of a conductor film are impaired. Further, since these additives must be added in large quantities to achieve an effect, such a problem as an increase in resistance value arises.

U.S. Pat. No. 5,126,915 discloses a method for suppressing sintering by coating each metal particle with a metal oxide such as titanium oxide, aluminum oxide or chromium oxide by a wet process. However, this method has an effect of increasing the sintering initiation temperature but is liable to cause sintering and shrinkage abruptly after the initiation of sintering. Therefore, this method does not overcome disagreement between the sintering and shrinkage behaviors of the conductor layer and those of the ceramic layer at a high temperature range. This is assumed to be because these oxide layers decompose rapidly or separate from the nickel particles quickly in a non-oxidative atmosphere at a high temperature, for example, 1,200° C. or more.

The inventors of the present invention have developed a method for controlling sintering by forming a vitreous thin film on the surface of a metal particle and further a method for preventing the oversintering of a nickel particle by forming a specific composite oxide layer on the surface of a nickel particle. They have conducted further studies based on the above studies and have arrived at the present invention.

SUMMARY OF THE INVENTION

It is an object of the present invention to obtain a conductor film having high conductivity by suppressing the sintering of a nickel particle effectively even when the film is thin.

It is another object of the present invention to provide a method for preventing the disruption and structural defects of a conductor film by delaying the initiation of sintering of a nickel particle so as to bring the sintering and shrinkage behaviors of the nickel particle as close as possible to those of a ceramic layer and reduce the thickness of the conductor film where the nickel particle is used for a conductor paste to be co-fired with unfired ceramic layers to provide multilayer electronic parts and the like.

It is still another object of the present invention to provide a simple and excellent process for producing such a nickel particle.

The inventors of the present invention have continued further studies based on the above studies, have found that the above objects can be attained by forming a layer of a nickel-containing spinel on the surface of nickel particles and have accomplished the present invention.

More specifically, the present invention is directed to nickel composite particles having a layer of a nickel-containing spinel on at least a part of the surface of nickel particles, or nickel composite particles having an oxide layer of metals other than nickel on at least a part of the surface of nickel particles and a layer of a nickel-containing spinel at an interface between the nickel particle and the metal oxide layer.

The present invention is also directed to a process for producing the above composite nickel particles, comprising:

forming fine liquid droplets from a solution containing (a) at least one thermally decomposable compound of nickel and (b) at least one thermally decomposable compound of a metal capable of forming a spinel together with nickel; and heating the liquid droplets at a temperature higher than the decomposition temperature of the compound (a) and the decomposition temperature of the compound (b) to form nickel particles and simultaneously deposit a layer of a nickel-containing spinel in the vicinity of a surface of the nickel particles or to form nickel particles and simultaneously deposit a metal oxide layer and a layer of a nickel-containing spinel in the vicinity of a surface of the nickel particles.

The present invention is further directed to a conductor paste containing the above nickel composite particles and to a ceramic multilayer electronic part having a conductor layer formed using the conductor paste.

DETAILED DESCRIPTION OF THE PREFERRED EMBODIMENTS

The nickel-containing spinel (hereinafter, referred to as "nickel spinel") in the present invention means a composite metal oxide comprising nickel as a constituent element and having a spinel structure or a spinel-related structure.

Examples of the metal oxides, other than nickel, constituting the nickel spinel include aluminum oxide, chromium oxide, manganese oxide, oxides of alkaline earth metals, such as magnesium, calcium, strontium, barium or the like. The oxides, such as aluminum oxide, chromium oxide, manganese oxide, etc., form with nickel oxide a composite metal oxide having a stable spinel structure, that is, $NiAl_2O_4$, $NiCr_2O_4$, $NiMn_2O_4$ or the like at a high temperature. On the other hand, the alkaline earth metal oxides are considered to be present in a form of partial substitution of nickel in the spinel structure and form a composite metal oxide having a spinel structure or a spinel-related structure with other components. For example, in a case where nickel spinel, such as $NiAl_2O_4$, is fired at a high temperature in a reducing atmosphere in the preparation of a barium titanate capacitor, the spinel may possibly react with barium titanate and decompose, thereby deteriorating the properties of the resulting capacitor. In such a case, the addition of alkaline earth metal oxides is effective in stabilizing the spinel structure.

The nickel spinel layer may be existent in the vicinity of the surface of the nickel particles in an effective form for preventing the sintering of nickel, for example, it covers the surface of the nickel particles or is segregated in high concentration on the surface and/or in the vicinity of the surface of the nickel particles. This spinel layer must be existent at the interface between the nickel layer and the oxide layer of metals other than nickel in a case where the latter is existent on the nickel particles. The metal oxide layer preferably includes oxides of metals other than nickel or a composite oxide thereof.

Hereinafter, composite particles containing the oxide layer of metals other than nickel (referred to as "metal oxide layer") and the layer of nickel spinel (hereinafter, referred to "spinel layer") are more specifically described. The description is also applied to composite particles having only the spinel layer thereon.

Since this spinel layer exists at the interface between the metal oxide layer and the nickel particles from the beginning in the nickel composite particles of the present invention, adhesion between the metal oxide layer and the nickel particles is improved and abrupt phase separation does not occur even when the nickel composite particles are fired in a non-oxidative atmosphere. Since the metal oxide and spinel separate or decompose gradually, they are existent stably on the surface of the nickel particle as a solid phase up to a high temperature, whereby not only does the sintering initiation temperature of the nickel particle rise, but also sintering is controlled up to a considerably elevated temperature range even after the initiation of sintering. Therefore, sintering proceeds to its end at a moderate speed. Therefore, the oversintering of the nickel particles and a rise in conductor resistance, disconnection, an increase in the thickness of the film, delamination and the like, which are caused by mismatch of shrinkage behavior between the conductor layer and the ceramic layer when they are co-fired are prevented, and a thin nickel conductor having excellent conductivity and adhesion is formed.

Regarding to the amount of the oxides of metals other than nickel included in the nickel composite particles of this invention, even when the total amount of those oxides in the metal oxide layer and the spinel layer is as small as 0.01 wt % or so based on nickel, it is effective but it is preferably 0.05 wt % or more. When the total amount is too large, the nickel particles may not be sintered at all. Therefore, the total amount are preferably about 20 wt % or less from a practical point of view because conductivity is lowered by a reduction in the proportion of nickel oxide and the metal oxides have an influence upon the electric properties of a dielectric material when the nickel composite particles are used in a capacitor or the like.

In the surface of the nickel composite particles, nickel oxide may also be present within the amount which does not lower the effects of the present invention.

The metal oxide layer and the spinel layer may be formed by any processes as long as the nickel spinel is formed at the interface between the nickel particles and the metal oxide layer. For example, the processes include one in which an aluminum compound or the like is adhered to the surface of nickel particles by a wet process such as a sol-gel process and thermally treated at high temperatures, one making use of spray pyrolysis, and one in which a heat treatment is carried out at high temperatures after nickel particles and a metal oxide are mechanically mixed together.

Preferably, the particles of the present invention are produced by a spray pyrolysis process. As described in Japanese Patent Publication No. 63-31522 and Japanese Patent Application Laid-open No. 6-279816, in the spray pyrolysis process, metal or alloy particles are deposited by atomizing a solution containing at least one metal compound to form fine liquid droplets and heating the liquid droplets at a temperature higher than the decomposition temperature of the metal compound, preferably a temperature close to the melting point of the metal or higher than the melting point to thermally decompose the metal compound.

This process can provide nickel particles having high crystallinity, high density and high dispersibility and can easily control the particle size of the nickel particles. In addition, the nickel composite particles of the present invention can be obtained by a single operation by adding metal compounds, such as an aluminum compound or the like, to a raw material nickel compound solution, thereby making it possible to eliminate the need for any additional coating steps. It is assumed that a metal oxide such as aluminum oxide deposited by thermal decomposition is expelled out to the surface of the nickel particles because the crystallinity of the produced nickel particles is high, deposited in the vicinity of the surface and reacted with nickel at the interface to form a spinel layer in such a manner that it gets into both layers. Therefore, the metal oxide layer and the nickel layer are firmly bonded to each other. Further, it is assumed that the bonding interface between nickel and the metal oxide is formed by a metal-ceramic gradient structure, thereby enhancing the adhesion between the nickel layer and the metal oxide in cooperation with the spinel structure and preventing the breakage of a particle structure caused due to the mismatch of thermal expansion coefficient during firing. Consequently, a stable metal-ceramic bonded structure is retained even at a temperature as high as 1,000° C. or higher and sintering can be advantageously delayed. Since the metal oxide deposits relatively evenly on the surface, a desired effect can be obtained even with a small amount of the metal oxide. Further, in the spray pyrolysis method, the metal composition of the resultant particles is in agreement with that of the starting metal compounds in the solution, making it easy to control the composition of the resultant particles, which in turn renders the spray pyrolysis method suitable for the production of the nickel composite particles of the present invention.

In the process of the present invention, one or more thermally decomposable compounds, such as a nitrate, sulfate, oxynitrate, oxysulfate, chloride, ammonium complex, phosphate, carboxylate, metal alcoholate or resinate may be used as the raw material compounds of the nickel compound and the metal oxide. A double salt, complex salt or metal oxide colloidal solution may be used.

Fine liquid droplets are formed from a solution of these compounds dissolved in water, an organic solvent such as alcohol, acetone or ether or a mixed solvent thereof by an atomizer such as an ultrasonic atomizer or a twin-fluid nozzle atomizer and heated at a temperature higher than the decomposition temperature of the metal compounds and a temperature at which a spinel composed mainly of nickel oxide and the metal oxide is formed for thermal decomposition. The formation temperature of the spinel is 800° C. or more, although it depends on the type of the oxide and conditions. The heat treatment is preferably carried out at the melting point of nickel or a temperature higher than that but may be carried out at a temperature lower than the melting point when high density, shape uniformity and the like are not required. Heating is carried out in a reducing or inert atmosphere, preferably a weak reducing atmosphere containing hydrogen, carbon monoxide and the like.

The conductor paste which contains the nickel composite particles of the present invention as a conductor element is produced by mixing and dispersing the nickel composite particles into an organic vehicle uniformly in accordance with a commonly used method. Other conductive particles or an inorganic binder (e.g., glass particles) and other additives may be contained as required.

The nickel composite particles of the present invention is especially suitable for use in an internal conductor paste for ceramic multilayer electronic parts such as a multilayer capacitor and multilayer PTC (positive temperature coefficient) element, composite parts incorporating these, composite substrates and the like but may be used in other ordinary thick film conductor pastes.

Examples and Comparative Examples are given to further illustrate the present invention.

EXAMPLES 1 to 5

Nickel nitrate hexahydrate was dissolved in water to a nickel concentration of 50 g/l. Aluminum nitrate nonahydrate was dissolved in this solution in amounts of 0.05, 0.1, 0.5, 1.0 and 2.0 wt % in terms of $Al_2O_3$ based on elemental nickel to prepare raw material solutions.

Fine liquid droplets were formed from each of the raw material solutions using an ultrasonic atomizer and supplied into a ceramic tube heated at 1,500° C. with an electric furnace using a weakly reducing gas as a carrier. The liquid droplets were thermally decomposed while they passed through a heating zone to form nickel particles containing aluminum oxide.

The specific surface area of the obtained particles was about 1.2 m$^2$/g. When the nickel particles containing 1.0 wt % of $Al_2O_3$ were analyzed by an X-ray diffractometer, nickel and a trace amount of nickel aluminum spinel ($NiAl_2O_4$) were detected. Nickel and trace amounts of $NiAl_2O_4$ and $Al_2O_3$ were detected in nickel particles containing 2.0 wt % of $Al_2O_3$ by X-ray diffraction. When a portion around the surface of the particle was observed by TEM, fine particles considered as $Al_2O_3$ were firmly adhered to the nickel particles by $NiAl_2O_4$.

The sintering behavior of these composite particles was evaluated for each sample by carrying out thermomechanical analysis (TMA) in an $N_2$—$H_2$ reducing atmosphere and the sintering and shrinkage initiation temperature and the sintering and shrinkage end temperature thereof are shown in Table 1.

Then, a paste of the obtained nickel composite particles was formed using a dihydroterpineol solution of ethyl cellulose as a vehicle. This paste was printed on a 99.6% alumina substrate and fired at 1,300° C. in an $N_2$—$H_2$ reducing atmosphere to form a conductive film of about 1 μm in thickness. The sheet resistance value of the film was measured and shown in Table 1.

EXAMPLES 6 and 7

Nickel particles having a chromium oxide layer on the surface were obtained in the same manner as in Examples 1 to 5 except that chromium nitrate nonahydrate was added in place of aluminum nitrate nonahydrate. It was found by X-ray diffraction and TEM that $NiCr_2O_4$ having a spinel type structure was existent on the surface of the nickel particles.

The sintering and shrinkage initiation temperature of the particles and the sintering and shrinkage end temperature of the nickel particles were measured by TMA and shown in Table 1. A nickel conductive film of about 1 μm in thickness was formed in the same manner as in Example 1 and the sheet resistance value of the film is shown in Table 1.

EXAMPLE 8

Nickel particles having a composite oxide layer containing aluminum and magnesium on the surface were obtained in the same manner as in Example 4 except that aluminum nitrate nonahydrate and magnesium nitrate hexahydrate were mixed so as to yield aluminum oxide and magnesium oxide in equimolar amounts and added.

It was found by X-ray diffraction and TEM that an oxide layer having a spinel type structure was existent on the surface of the nickel particles. The diffraction peaks of this spinel phase slightly shifted towards a lower angle as compared with the diffraction peaks of $NiAl_2O_4$. This result shows that Ni was partially replaced with Mg and present as $(Mg,Ni)Al_2O_4$. Also, besides the diffraction peaks of the spinel phase, weak diffraction peaks assumed as MgO was detected.

The sintering and shrinkage initiation temperature of the particles and the sintering and shrinkage end temperature of the nickel particles were measured by TMA and shown in Table 1. A nickel conductive film was formed in the same manner as in Example 1 and the sheet resistance value of the film is shown in Table 1.

EXAMPLE 9

Nickel particles having a composite oxide layer containing chromium and magnesium on the surface were obtained in the same manner as in Example 8 except that chromium nitrate nonahydrate was added in place of aluminum nitrate nonahydrate.

It was found by X-ray diffraction and TEM that an oxide layer having a spinel type structure was existent. Also in this X-ray diffraction, shift was observed in the diffraction peaks of this spinel phase as compared with $NiCr_2O_4$. This reveals that Ni was partially replaced with Mg and present as $(Mg,Ni)Cr_2O_4$.

The sintering and shrinkage initiation temperature of the particles and the sintering and shrinkage end temperature of the nickel particles were measured by TMA and shown in Table 1. A nickel conductive film was formed in the same manner as in Example 1 and the sheet resistance value of the film is shown in Table 1.

COMPARATIVE EXAMPLE 1

Pure nickel particles were obtained in the same manner as in Example 1 except that aluminum nitrate nonahydrate was not added. The sintering and shrinkage initiation temperature and the sintering and shrinkage end temperature of the pure nickel particles and the sheet resistance value of a nickel conductive film formed in the same manner as in Examples are shown in Table 1.

TABLE 1

| | Additives | Added Amount (wt. %) | Sintering/Shrinkage initiation temperature (° C.) | Sintering/shrinkage end temperature (° C.) | Sheet resistance value of conductive film (mΩ/□) |
|---|---|---|---|---|---|
| Example 1 | $Al_2O_3$ | 0.05 | 300 | 680 | 168 |
| Example 2 | $Al_2O_3$ | 0.1 | 300 | 840 | 102 |
| Example 3 | $Al_2O_3$ | 0.5 | 930 | 1200 | 90 |
| Example 4 | $Al_2O_3$ | 1.0 | 960 | >1300 | 97 |
| Example 5 | $Al_2O_3$ | 2.0 | 1000 | >1300 | 145 |
| Example 6 | $Cr_2O_3$ | 0.1 | 300 | 900 | 137 |
| Example 7 | $Cr_2O_3$ | 1.0 | 1000 | >1300 | 105 |
| Example 8 | $Al_2O_3$ + MgO | 1.0 | 1000 | >1300 | 71 |
| Example 9 | $Cr_2O_3$ + MgO | 1.0 | 1000 | >1300 | 80 |
| Comparative Example 1 | — | — | 300 | 590 | 217 |

COMPARATIVE EXAMPLE 2

A nickel conductive film was formed in the same manner as in Examples by adding 0.5 wt % of $Al_2O_3$ fine particles to the pure nickel particles of Comparative Example 1. When the sheet resistance value of the nickel conductive film was measured, it was 314 mΩ/□.

As is obvious from Examples and Comparative Examples, the sintering and shrinkage of the pure nickel particle start at about 300° C. and end at about 600° C. whereas the sintering and shrinkage of the nickel composite particles of the present invention end at a temperature higher than that and proceed more gently than the pure nickel particle. As the amount of the metal oxide increases, sintering at low temperatures can be suppressed and this effect is the largest when the amount is 0.5 wt % or more.

With respect to the conductor film formation, in Comparative Example 1, sintering of the film excessively proceeded along with a rise in firing temperature and disconnection was apt to occur, thereby resulting in a significant increase in the resistance value. This phenomenon was not improved only by adding $Al_2O_3$ to the paste as in comparative Example 2 and the resistance value increased. However, the oversintering of the film is inhibited and the conductivity of the film is improved by using the nickel composite particles of the present invention.

Since sintering at low temperatures of the nickel composite particles of the present invention is suppressed, the initiation of shrinkage thereof during firing a nickel paste is delayed, and the progress speed of sintering thereof is moderately suppressed even in a high temperature range, abrupt shrinkage and oversintering do not occur. Therefore, in an electronic part such as a multilayer capacitor or the like, the sintering and shrinkage behaviors of a nickel conductor layer can be approximately coincided with those of a ceramic layer and a commercial product having a high reliability and a high performance and free from the disconnection of a conductor film and structural defects can be produced at a high yield. Further, the nickel composite particles of the present invention makes it possible to reduce the thickness of an internal conductor layer and further reduce the size and increase the number of layers of a multilayer electronic part.

What is claimed is:

1. A conductor paste comprising a nickel composite particle having a layer of a nickel-containing spinel deposited thereon at least a part of a surface of the nickel particle.

2. A ceramic multilayer electronic part wherein a conductor layer is formed using the conductor paste according to claim 1.

3. A conductor paste comprising a nickel composite particle having an oxide layer of a metal other than nickel on at least a part of a surface of a nickel particle and a layer of a nickel-containing spinel at an interface between the nickel particle and the metal oxide layer.

4. A ceramic multilayer electronic part having a conductor layer formed from a conductor paste comprising a nickel composite particle having an oxide layer of a metal other than nickel on at least a part of a surface of a nickel particle and a layer of a nickel-containing spinel at an interface between the nickel particle and the metal oxide layer.

* * * * *